United States Patent [19]

Savery

[11] 4,280,885
[45] Jul. 28, 1981

[54] METHOD OF AND APPARATUS FOR ACTIVE ELECTRO-CHEMICAL WATER AND SIMILAR ENVIRONMENTAL CONTAMINANT ELIMINATION IN SEMI-CONDUCTOR AND OTHER ELECTRONIC AND ELECTRICAL DEVICES AND THE LIKE

[76] Inventor: James W. Savery, 23 Elaine St., Hudson, N.H. 03051

[21] Appl. No.: 92,695

[22] Filed: Nov. 9, 1979

[51] Int. Cl.³ .................... C25B 1/02; C25B 1/04; C25F 7/00
[52] U.S. Cl. .................... 204/129; 204/130; 204/147; 204/149; 204/195 S; 204/271; 204/272; 316/25; 252/181.1; 357/78
[58] Field of Search .................... 204/130, 180 R, 129, 204/147, DIG. 6, 1 R, 195, 299 R, 196, 266, 272, 271, 265; 316/25; 252/181.1; 357/78

[56] References Cited

U.S. PATENT DOCUMENTS

| | | | |
|---|---|---|---|
| 1,677,032 | 7/1928 | Kaffer | 204/129 X |
| 2,351,282 | 6/1944 | Oliver, Jr. | 204/129 X |
| 2,816,067 | 12/1957 | Keidel | 204/129 X |
| 3,223,609 | 12/1965 | Reeds, Jr. | 204/129 X |
| 3,240,693 | 3/1966 | Gardner | 204/272 X |
| 3,923,629 | 12/1975 | Shaffer | 204/272 X |
| 4,094,751 | 6/1978 | Nozik | 204/129 X |

Primary Examiner—Arthur C. Prescott
Attorney, Agent, or Firm—Rines and Rines, Shapiro and Shapiro

[57] ABSTRACT

This disclosure involves the employment of novel assemblies of electrode structures deposited upon, for example, strongly hygroscopic insulators and activated by small voltages to effect active electrolysis of adsorbed water as an effective getter for semiconductor and similar devices, with the process of preparation of the same being adapted either to enable modification of existing devices, or for supplementation to existing device manufacturing processes.

22 Claims, 3 Drawing Figures

METHOD OF AND APPARATUS FOR ACTIVE ELECTRO-CHEMICAL WATER AND SIMILAR ENVIRONMENTAL CONTAMINANT ELIMINATION IN SEMI-CONDUCTOR AND OTHER ELECTRONIC AND ELECTRICAL DEVICES AND THE LIKE

The present invention relates to methods of and apparatus for the active electrochemical elimination of water (which term is herein used generically also to embrace water and like vapors) and similar environmental contaminants in electronic and electric devices and assemblies and the like; being more particularly directed, in a principal and preferred area of application, to the active getter-electrolysis of water in electronic component and circuit devices, such as semi-conductor assemblies, housings and packages, including integrated and microcircuit assemblies, digital watch liquid crystal displays, water-sensitive resistors, conductors and other components.

It has heretofore been recognized that a hygroscopic substance which becomes conductive when wet, may, upon application of a potential to the substance, enable drying by electrolysing the water into gaseous hydrogen and oxygen. Examples of such prior drying techniques are presented in U.S. Pat. Nos. 2,816,067; 3,038,853; 3,062,732; 3,188,283; 3,244,602; 3,313,718; 3,400,069; 3,465,193; and 3,474,023. An electrical apparatus housing of calcium carbide or the like is disclosed in French Pat. No. 414,803 for absorbing water vapor and generating a gas.

Unfortunately, the structures and underlying techniques for such prior uses do not lend themselves to the miniaturized, low-voltage, temperature-pressure-moisture variations of electrical characteristics and other critical and peculiar vagaries of microelectronic and similar devices, assemblies and packages; and they have therefore not apparently previously been considered in the art as applicable to the environmental contaminant problems of, for example, semi-conductor, integrated and microcircuits, liquid crystal displays and the like. Resort has therefore been made to entirely different techniques in this different problem area, including sealing semi-conductor devices in metal cans and the like with glass-to-metal seals for affording protection against the performance-degrading action of liquids and gases; and encapsulating the devices in as dry an atmosphere as possible, as of nitrogen, containing typically less than 1-2 parts per million of water vapor.

If, because the conditions have not been chosen properly or because of damage to the glass-metal seals, the water vapor content inside the package is allowed to rise, degradation of the electrical characteristics of the semi-conductor or the like will rapidly occur, with ultimate failure. For the purpose of applications requiring the highest reliability, accordingly, such as in missiles and space applications and the like, very rigorous conditions have been imposed upon the testing of the completed packages themselves to be sure that they are hermetically or atmospherically sealed, and with costly quality control testing procedures such as helium leak detection, and, more recently, radioactive gas leak detection. The weak link of the metal package, however, and despite the copious testing that is done, resides in the fact that the device is still prone to a degradation called microcracking. The stress of the soldering or welding operation of the lead conductor (s), or the physical movement of the lead area, may be such as to form micro-cracks in the glass-to-metal seals, which ultimately fail because of a combination of the microcrack acting as a stress riser, and the capillary action that draws water to that area, initiating additional cracking, and so on. Though preliminary testing may thus be done on the package itself, even to the extent of about $1 \times 10^{-8}$ ATM cc/SEC. leak detection, this is no insurance that the device will, in service, maintain its hermaticity. To the contrary, within a period of several months of use, the water vapor content inside a package can approach several thousand parts per million, which is enough to cause degradation.

An additional complication arises because of the nature of materials that are currently used to make semi-conductor circuits and that contain or give off water and similar vapors as time progresses. Despite the attempt to contain the device function inside a protective atmosphere, thus, there may be evolution inside the package itself or water which ultimately will degrade the circuit performance. If ionizable solids are present within the package and there is condensation of water, the ionizable solids will dissolve in the water, forming an environmental contaminant which, under the influence of electrical fields, will migrate to places in the circuit that cause problems.

An object of the present invention, accordingly, is to provide a new and improved method of and apparatus for eliminating environmental contaminants including water in semi-conductor and other electronic and electrical devices and packages and the like that shall not be subject to the above-described disadvantages but that, to the contrary, can prevent function degradation despite such effects as water vapor development resulting from micro-cracking and/or the generation of contaminants from the materials within the packages, during use.

A further object is to provide such a novel method and apparatus operating upon the principle of continual and active electro-chemical action; specifically, for the case of water and ionizable solids and the like dissolvable therein, by electrolysis.

Still a further object is to provide an improved getter apparatus and method of fabrication therefor particularly suited for semi-conductor, integrated circuit, thin and thick film, and other technologies; being, indeed, useable as a modification or insertion in previously designed devices and packages, or susceptible of incorporation in the design and fabrication of the devices themselves.

Other and further objects will be explained hereinafter and are more particularly delineated in the appended claims.

In summary, however, from one of its important aspects, the invention embraces a method of electro-chemically eliminating water and contaminants within an electronic package and the like, that comprises, applying an electric field between a pair of closely spaced co-extensive conductive paths, disposing the paths along a hygroscopic insulating surface disposed within the package, and adjusting the path dimensions and separation relative to the electric field to hydrolize water within the package into hydrogen and oxygen gases. Preferred details and supplemental features are hereinafter presented, as are best mode operational details.

In accordance with the present invention, thus, despite the small size, low voltages and esoteric materials involved in semi-conductor devices and microcircuits and the like and the materials thereof, an active novel getter is introduced into the device or package that in fact transforms any water developing therewithin by electrolysis into hydrogen and oxygen gases, serving also thereby to cause the pressure inside the package to rise slightly and thus prevent or reduce the rate at which any incoming water vapor could enter the package.

The cost of effecting this result, other than the manufacture and installation of the getter itself, is the small drain of electricity involved in the electrolysis.

In accordance with a further feature of the invention, the processes for making getter structures can be made readily compatable with the processes used in making the semi-conductors themselves, and, indeed, need not involve a separate item, if desired, but rather a special initial design of the semi-conductor or chip or circuit to embody the getter principle for its protection, and consequently at a trivial cost relative to the improved reliability of the function.

The invention will now be described with reference to the accompanying drawing,

FIG. 1 of which is an isometric view upon an enlarged scale, of a preferred form of the invention, particularly adapted for use in semi-conductor, integrated and microcircuits and the like;

Figure 1:
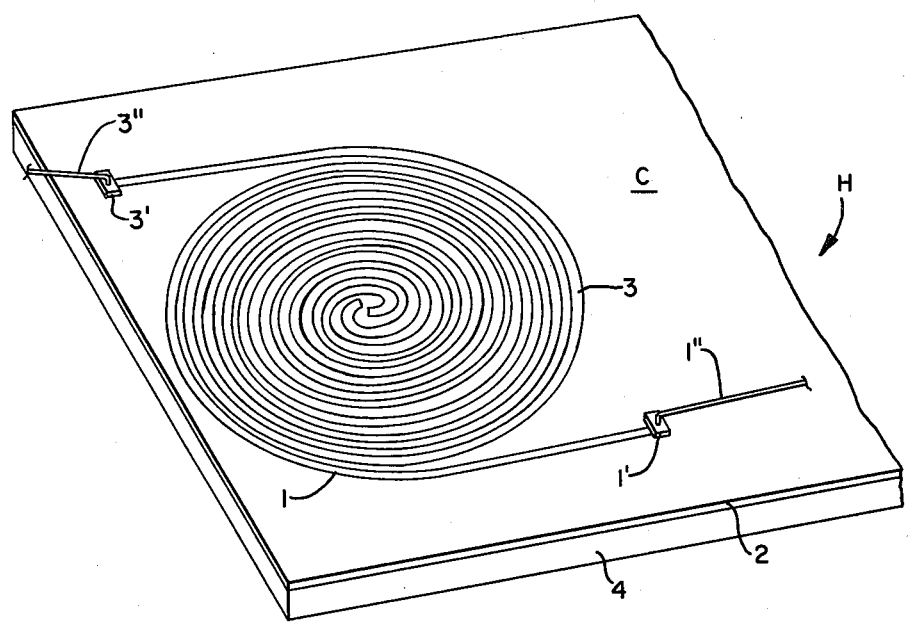

Referring to FIG. 1, a preferred embodiment suitable for semi-conductor, integrated circuits, microcircuits, liquid crystal displays and a host of similar applications is illustrated disposed in a sealed package or housing H with other electronic components generally indicated at C. The getter apparatus is shown in the form of a pair of co-extensive, co-planar interleaved spiral electrodes 1 and 3, as of gold or gold-alloy, as later more fully described, deposited upon a planar insulating layer 2, such as a silicon dioxide layer, doped or combined with a highly hygroscopic material such as phosphoric oxide ($P_2O_5$), and formed upon a silicon substrate 4.

In forming such a structure, using techniques compatable with the arts above-mentioned, either N-type or P-type silicon slices 4 may be employed. By growing the oxide coating 2 at a high temperature, a relatively thick insulating silicon dioxide layer 2 can be readily formed, say of the order of 3000–10000 Angstroms, more or less. In the exemplary construction beforedescribed, phosphorus may introduced as a dopant into the furnace to produce a glass in combination with the silicon dioxide, a good absorbing material for water vapor.

Figure 2:
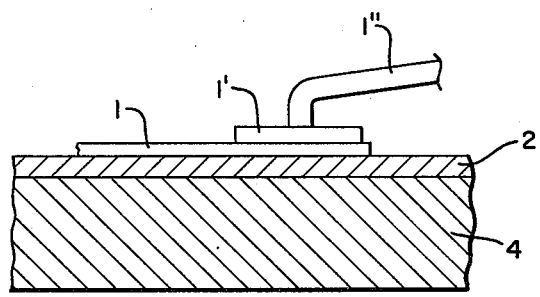
FIG. 2 is an enlarged fragmentary section at the terminal region.

The structure 2 may then be metallized in any desired geometrical pattern to form coextensive electrodes, by putting on layers of, for example, chrome or nichrome and gold. The chrome is applied, for example, in about a 1000 Angstrom thickness or less to form an adherent surface to the phosphorus-doped silicon dioxide glass layer 2. Then the gold is applied in a thin layer on top of the chrome to form a bonding area. This particular technique of building up a chrome-gold or nichrome-gold structure insures not only electrode surfaces that will not become pitted or corroded (because of the non-oxidizing characteristics of gold), but it also enables the ready formation of suitable pad areas 1' and 3' that connect to the electrode elements themselves and to which gold wires 1'' and 3'' are attached to provide contact outside the device where conductor leads can be soldered in place (FIG. 2).

It has been found that if the electrodes 1 and 3 are properly closely spaced, and of appropriate dimensions, hydrolysis rapidly takes place under the action of the electric field between the electrodes generated by very low DC potentials or voltages applied between the electrodes, effecting the active, continual electrolysis of water into hydrogen and oxygen gases within the housing, and admirably maintaining the function of components or circuits C within the package H against any substantial degradation in performance. Higher voltages are used with wider electrode spacings.

The interleaved co-extensive spiral electrode configuration illustrated is preferred for efficient area utilization and processing yield. With overall spiral electrode lengths of about 0.3 cm, (typical useful lengths being of the order of between 0.03 and 0.3 cm.), covering an area of about 0.0031 cm.$^2$, a conductor width of about 0.025 mm., and a substantially uniform electrode path spacing or separation of about 0.25 mm, (within limits of the order of about 0.001 to 0.025 mm.), low DC voltages applied between the pads 1' and 3' of the order of from about 5.0 to 10 volts (more generally, from about 400 volts/cm. to 100,000 volts/cm., and in some instances from about 1 to 50 volts), have been found to remove water vapor and contaminants dissolved in the same with continual and rapid efficacy. The resistance of the hygroscopic insulating surface 2 is preferably adjusted to the order of from about $1 \times 10^{15}$ to $1 \times 10^{12}$ ohms per square, being preferably about 8000 Angstroms in thickness.

Figure 3:
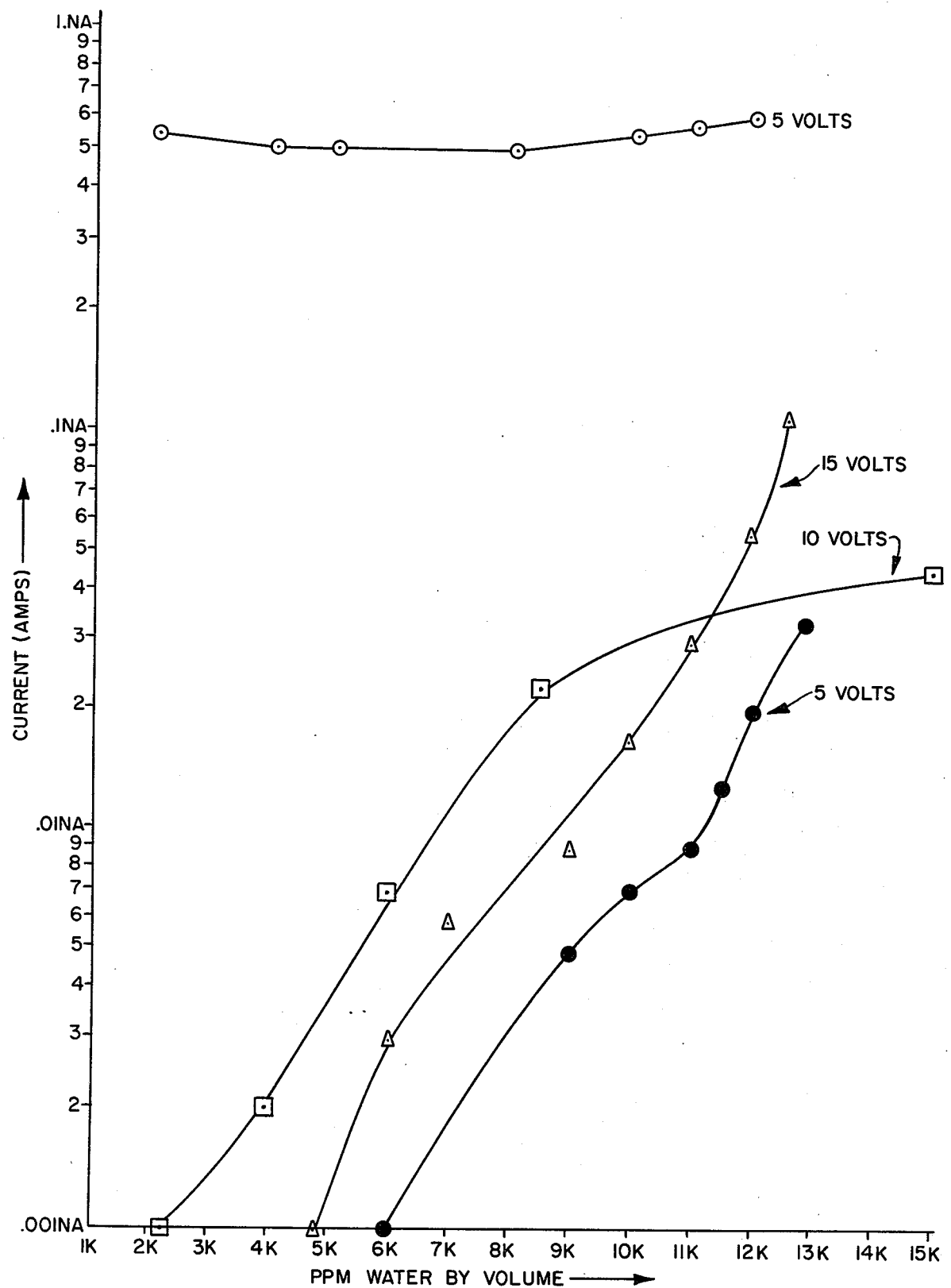
FIG. 3 is a graph illustrating the typical variation of current in the getter with varying humidity for different applied voltages.

Referring to the graph of FIG. 3, as the water vapor increases (plotted along the abscissa), the amount of current increases (plotted along the ordinate), with the device operable over wide ranges if adequate $P_2O_5$ is provided, as later discussed, and with the device then not particularly voltage dependent. The performance is plotted for 5, 10 and 15 volts of applied D.C. voltage at the lower portion of FIG. 3, with, respectively, about 1.5%, 1.5% and 4.5% $P_2O_5$. The uppermost flat curve was obtained for less than 0.1% $P_2O_5$ and shows that the critical characteristic performance of the invention cannot be obtained with such levels of doping.

It has been found that when the applied voltage is less than about 1.5 volts, the getter action starts to become sluggish; and for the closer electrode spacings, lower voltages are desirable.

The degree of phosphorus or other doping agent for providing hygroscopic effects is important. If too much phosphorus is applied, then very low resistances occur as contrasted with the desired several hundreds of megohms. Too much phosphorus develops conditions where there is direct conduction through the layers which is undesirable from the standpoint that current is wasted in passing through the oxide layer itself, rather than being used in the hydrolizing of the water, and portions of the glass dissolve. Preferred quantities of phosphorus are from about 0.2 to 8 mol percent $P_2O_5$ (generally greater than 0.1%), with thicker oxides for higher voltage devices.

While the invention has been illustrated in connection with a separate getter apparatus in the package H, it is clear that the same could be part of an integrated or microcircuit chip 2-4 or an extension thereof and be formed during the manufacture of the same.

As another example of useful application of the invention, a digital watch case typically is waterproof, but not isolated from the ultimate penetration of moisture. By including the getter of the invention inside the case and applying voltage to the electrodes, the entering water vapor will be electrolyzed before it can attack the sensitive circuitry, with the result that, as the water is electrolyzed, the internal pressure inside the case will increase significantly because of the formation of a greater volume of hydrogen and oxygen gasses than was represented by the water vapor. This excess pressure will leak out through the same opening in the case where the water vapor entered. This protection is necessary for liquid crystal displays, due to their nature, as well as most microcircuits. The invention finds similar use with hearing aid amplifiers and other electronic and electrical systems.

An alternate process for achieving the same structure, perhaps with a heavier phosphorus concentration, may involve etching a window or partial recess in the oxide layer itself, which allows the contact between the electrode metal and the silicon dioxide to be made at a lower doping level therein. A further method, which allows almost any combination of glasses or deposited oxide, may involve applying the metal directly on top of the substrate, then applying a doped oxide or glass over the whole assembly, and then opening areas over the metal for lead attachment.

While a spiral electrode geometry has been illustrated, it will be understood that other geometrical configurations may also be used, and that further modifications will occur to those skilled in this art without departing from the spirit and scope of the invention as defined in the appended claims.

What is claimed is:

1. A method of electrochemically eliminating water and contaminants within an electronic package and the like, that comprises, applying an electric field between a pair of closely spaced co-extensive conductive paths, disposing the paths along a hygroscopic insulating surface disposed within the package, and adjusting the path dimensions and separation relative to the electric field to hydrolize water within the package into hydrogen and oxygen gases.

2. A method as claimed in claim 1 and in which said insulating surface is substantially planar and said paths are substantially co-planar.

3. A method as claimed in claim 1 and in which the path separation is of the order of about 0.001 mm to 0.025 mm, the path length from about 0.03 to 0.3 cm, and the potential of the electric field from about 400 volts/cm to 100,000 v/cm.

4. A method as claimed in claim 1 and in which the resistance of said hygroscopic insulating surface is adjusted to be within the range of from about $1 \times 10^{15}$ ohms per square to $1 \times 10^{12}$ ohms per square.

5. A method as claimed in claim 1 and in which said hygroscopic insulating surface is prepared by oxidizing a silicon substrate and doping the oxide to render the same hygroscopic.

6. A method as claimed in claim 5 and in which said doping comprises employing phosphorus.

7. A method as claimed in claim 6 and in which the oxide is formed of thickness in the range of from about 3000° A. to 10,000° A. and the level of phosphorus oxide is in the range of from about 0.2 to 8 mol percent $P_2O_5$.

8. A method as claimed in claim 5 and in which said paths are formed by depositing one of nichrome-gold and chrome-gold conductors upon the doped oxide.

9. A method as claimed in claim 1 and in which said paths are disposed in interleaving spiral fashion.

10. A method as claimed in claim 1 and in which said hygroscopic insulating surface containing said paths is inserted as a separate element in said package.

11. A method as claimed in claim 1 and in which said hygroscopic insulating surface containing said paths is formed as part of the fabrication of other electronic parts contained within said package.

12. A method as claimed in claim 10 and in which said hygroscopic insulating surface is prepared by oxidizing a silicon substrate shared in common with another of said electronic parts, with said surface being doped to render the same hygroscopic.

13. A getter apparatus for electrochemically eliminating water and contaminants within an electronic package and the like, having, in combination, a highly hygroscopic substantially planar insulating surface mountable within the package, a pair of closely spaced co-extensive substantially co-planar conductors forming electrode paths along an area of said surface, and means for applying a voltage between the conductors to set up an electric field between the electrode paths formed thereby and in the space occupied by the hygroscopic surface portions between the conductors, with said voltage adjusted to effect hydrolysis of water in the vicinity thereof.

14. A getter apparatus as claimed in claim 13 and in which the spacing of said conductors is of the order of from about 0.001 mm to 0.025 mm, and said voltage is in the range from about 1 to 50 volts.

15. A getter apparatus as claimed in claim 1 and in which said material is silicon and the dopant comprises phosphorus.

16. A getter apparatus as claimed in claim 13 and in which said substantially co-planar conductors are disposed upon the said hygroscopic insulating surface.

17. A getter apparatus as claimed in claim 16 and in which said conductors are disposed in interleaved spiral form.

18. A getter apparatus as claimed in claim 16 and in which said conductors are metallized upon or within said surface.

19. A getter apparatus as claimed in claim 18 and in which the metallization is one of nichrome-gold and chrome-gold.

20. A getter apparatus as claimed in claim 13 and in which the same is part of an electronic part within the electronic package.

21. A getter apparatus for electrochemically eliminating water and contaminants within an electric package and the like, having, in combination, a highly hygroscopic substantially planar insulating surface mountable within the package, said hygroscopic insulating surface being an oxide layer of semi-conductor material doped to render it hygroscopic, a pair of closely spaced coextensive substantially co-planar conductors forming electrode paths along an area of said surface, and means for applying a voltage between the conductors to set up an electric field between the electrode paths formed thereby and in the space occupied by the hygroscopic surface portions between the conductors, with said voltage adjusted to effect hydrolysis of water in the vicinity thereof.

22. A getter apparatus for electrochemically eliminating water and contaminants within an electronic package and the like, having, in combination, a highly hygroscopic substantially planar insulating surface mountable within the package, a pair of closely spaced coextensive substantially co-planar conductors forming electrode paths along an area of said surface, and means for applying a voltage between the conductors to set up an electric field between the electrode paths formed thereby and in the space occupied by the hygroscopic surface portions between the conductors, with said voltage adjusted to effect hydrolysis of water in the vicinity thereof, said insulating surface being an oxide layer upon a silicon substrate shared in common with an electronic part.

* * * * *